(12) United States Patent
Hopkins

(10) Patent No.: US 10,965,096 B2
(45) Date of Patent: Mar. 30, 2021

(54) FIXTURE ASSEMBLY FOR TESTING SURFACE EMITTING LASER DIODES AND TESTING APPARATUS HAVING THE SAME

(71) Applicant: Chroma Ate Inc., Taoyuan (TW)

(72) Inventor: James E. Hopkins, Chandler, AZ (US)

(73) Assignee: CHROMA ATE INC., Taoyuan (TW)

( * ) Notice: Subject to any disclaimer, the term of this patent is extended or adjusted under 35 U.S.C. 154(b) by 125 days.

(21) Appl. No.: 16/358,800

(22) Filed: Mar. 20, 2019

(65) Prior Publication Data
US 2020/0303894 A1  Sep. 24, 2020

(51) Int. Cl.
  *H01S 5/00* (2006.01)
  *H01S 5/183* (2006.01)
  *H01S 5/024* (2006.01)

(52) U.S. Cl.
  CPC ............ *H01S 5/0014* (2013.01); *H01S 5/024* (2013.01); *H01S 5/183* (2013.01)

(58) Field of Classification Search
  CPC .... H01S 5/0014; H01S 5/024; H01S 5/02264; H01S 5/02236; H01S 5/02248; G01R 31/2635; G01R 1/0408; G01R 31/01; G01J 1/02; G01J 1/0223; G01J 1/4228; G01J 2001/0481; G01J 2001/4247; G01J 2001/4252; G01J 2005/608; G01J 3/51; H01L 2224/48091; H01L 2924/00; G02B 6/4201; G02B 6/4243; G02B 6/4245; G02B 6/4256
  See application file for complete search history.

(56) References Cited

U.S. PATENT DOCUMENTS

| | | | | |
|---|---|---|---|---|
| 6,797,936 | B1 * | 9/2004 | Kessler | G01R 31/01 250/221 |
| 6,860,648 | B2 * | 3/2005 | Jin | G02B 6/4225 385/88 |
| 7,777,247 | B2 * | 8/2010 | Loh | H01L 33/486 257/100 |
| 8,462,593 | B1 * | 6/2013 | Komura | G11B 5/6088 369/13.33 |
| 2002/0005522 | A1 * | 1/2002 | Miyokawa | G02B 6/4248 257/79 |
| 2003/0026554 | A1 * | 2/2003 | Jin | G02B 6/4249 385/89 |
| 2003/0072538 | A1 * | 4/2003 | Jin | G02B 6/4225 385/89 |

(Continued)

*Primary Examiner* — Mohamed K Amara
(74) *Attorney, Agent, or Firm* — McClure, Qualey & Rodack, LLP

(57) ABSTRACT

A fixture assembly for testing a surface emitting laser diode and a testing apparatus having the same are provided. The fixture assembly comprises a base, an upper cover and a latch mechanism. The base includes at least one pocket, and at least one electrical contact interface disposed in the pocket. The upper cover includes a body, an abutting block and a pressing member disposed in the body. The abutting block is engageable with the body for slidable movement with respect to the body. The latch mechanism is disposed on the base and the upper cover, and is configured to selectively connect or disconnect the base to or from the upper cover. When the latch mechanism is operated to connect the base to the upper cover, the pocket and an opening of the abutting block form into a through cavity through which the laser diode emits the laser beam.

9 Claims, 4 Drawing Sheets

(56) References Cited

U.S. PATENT DOCUMENTS

| | | | | |
|---|---|---|---|---|
| 2003/0091301 | A1* | 5/2003 | Lee | G02B 6/4277 385/89 |
| 2004/0082112 | A1* | 4/2004 | Stephens | H01S 5/02423 438/122 |
| 2005/0150740 | A1* | 7/2005 | Finkenzeller | G07D 7/01 194/207 |
| 2006/0077382 | A1* | 4/2006 | Wang | G01N 21/658 356/301 |
| 2007/0019960 | A1* | 1/2007 | Kuwata | G02B 6/4206 398/118 |
| 2007/0115617 | A1* | 5/2007 | Schulte | H01S 5/4025 361/671 |
| 2011/0133236 | A1* | 6/2011 | Nozaki | H01L 33/642 257/98 |
| 2013/0058367 | A1* | 3/2013 | Grove | H01S 5/024 372/36 |
| 2015/0332717 | A1* | 11/2015 | Hara | G11B 5/314 369/13.33 |

* cited by examiner

FIXTURE ASSEMBLY FOR TESTING SURFACE EMITTING LASER DIODES AND TESTING APPARATUS HAVING THE SAME

BACKGROUND OF THE INVENTION

1. Field of the Invention

The present invention relates to a fixture assembly for testing surface emitting laser diodes and a testing apparatus having the fixture assembly, in particular a fixture assembly for securing the surface emitting laser diodes and a testing apparatus for performing an electrical test and an optical test on the surface emitting laser diodes.

2. Description of the Related Art

The field of application for surface emitting laser diodes, such as Vertical-Cavity Surface emitting Laser (also known as VCSEL), is consistently expanding and thus the demand for VCSEL is increasing. To date, the field of application for the VCSEL should have covered distance detection, auto-focus, 3D sensing, iris recognition, as well as air and water quality testing. In particular, 3D sensing includes gesture recognition, face recognition etc.

Whether it is portable consumer electronics or industrial applications, there has been a growing tendency towards the minimization of the size of the electronics, which will inevitably restrict the sizes of the electronic components such as semiconductor wafers and laser diodes. With the reduction in size the connections available for temporary contact for testing gets smaller as well. As the connections occupy the surface area of the component to be tested, only a small portion of the surface area remains as the surface for thermal contact. In addition, fine pitch spring pins do not provide the sufficient force to make good thermal contact.

Some examples of art pertinent to the field are Chinese Utility Model Patent Publication No. CN201974446U and Chinese Invention Patent Publication No. CN106996990A. However, existing art including the above patents fail to overcome the drawbacks as mentioned above, and there are still rooms for improvement. For example, UM Publication No. CN201974446U entitled "Test fixture for power of laser diode chip", it simply discloses that the carrier grooves and the chip slots are disposed on the fixture, and a photodetector is used to test the components to be tested in the carrier grooves and chip slots. As such, there is no means for holding the components to be tested for precise positioning, and sufficient electrical contact between the components to be tested and the spring pins is not assured.

As to Invention Publication No. CN106996990A entitled "Test fixture for simultaneously testing multiple multi-pin laser devices", although means for clamping the components to be tested is disclosed therein, the mechanism of the means is too complicated and clamping has to be made by manually turning the handle. Further, the publication does not suggest the function of providing a burn-in test.

SUMMARY OF THE INVENTION

The primary object of the present invention is to provide a fixture assembly for testing surface emitting laser diodes, and a testing apparatus having the fixture assembly. The fixture assembly firmly clamps the laser diodes to accurately position the same, so that the testing apparatus is accessible to the beam emissions to each of the laser diodes, thereby ensuring all the pads of the laser diodes made sufficient electrical contact with the spring pins.

A further object of the present invention is to provide a fixture assembly for testing surface emitting laser diodes, which can be coupled with a mating contactor attached to a test resource. The coupling can be universal between equipment, thus providing repeatable handling of the fixture and not the components to be tested. In addition, unpackaged laser diodes are fragile and easily damaged by handling. Placing them into a fixture will reduce the chances that the delicate die and pads coming into contact with external devices. The laser diodes are protected from handling as they remain in the fixture throughout factory processes or tests.

To achieve the above object, a fixture assembly for testing at least one surface emitting laser diode comprising a base, an upper cover, and a latching mechanism is provided. The base includes at least one pocket, and at least one electrical contact interface disposed in the pocket. The upper cover includes a body, at least one abutting block having an opening and engageable with the body for slidable movement with respect to the body, and at least one pressing member disposed in the body. The latch mechanism is disposed on at least one of the base and the upper cover, and may selectively connect or disconnect the base to or from the upper cover. When the latch mechanism is operated to connect the base to the upper cover, the pocket and the opening of the abutting block form into a through cavity.

Accordingly, when the locking mechanism fastens the base to the upper cover, the pressing member presses on the abutting block, so that the abutting block and the pocket jointly hold and position the laser diodes to be tested. In addition, during testing, the laser emission emitted by the surface emitting laser diode can be passed through the through cavity formed by the pocket and the opening of the abutting block.

To achieve the foregoing object, the present invention provides a fixture assembly for testing surface emitting laser diodes. The surface emitting laser diode comprises a contact surface, and an emitting surface having a light emission area. The fixture primarily includes a base having at least one pocket for receiving the surface emitting laser diode, and at least one electrical contact interface disposed in the pocket for electrically connecting the contact surface of the surface emitting laser diode. The upper cover has a body, an abutting block having an opening, and a pressing member. The body has a groove for slidably receiving the abutting block; the pressing member is disposed between the body and the abutting block; and the abutting block includes an opening. The latch mechanism is disposed on at least one of the base and the upper cover, and is configured to selectively connect or disconnect the base to or from the upper cover. When the latch mechanism is operated to connect the base to the upper cover, the pocket and the opening of the abutting block form into a through cavity through which at least a portion of the light emission area exposes.

To achieve the foregoing object, the present invention provides a testing apparatus comprising a power supply, a fixture assembly as stated hereinbefore, a main controller, and a source measurement module configured to activate the surface emitting laser diode, and an electrical test and an optical test of the surface emitting laser diode are undertaken by the main controller.

DESCRIPTION OF THE PREFERRED EMBODIMENTS

Figure 1:
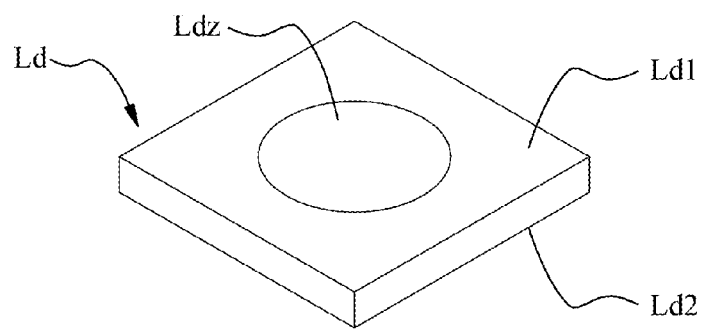
FIG. 1 is a perspective view schematically illustrating a surface emitting laser diode.

The present invention is related to a fixture assembly for testing surface emitting laser diodes and a testing apparatus having the fixture assembly. In the description, similar elements will be denoted by the same reference numerals. In addition, the drawings of the present invention are only intended to be illustrative, and are not necessarily drawn to scale, and all details are not necessarily shown in the drawing.

FIG. 1 is a perspective view schematically illustrating a surface emitting laser diode Ld, which generally includes an emitting surface Ld1 and a contact surface Ld2, wherein the emitting surface Ld1 includes a light emission area Ldz which emits the laser emissions. In addition, a plurality of electrical contacts (not shown) which serves as a medium for electrically connecting the diode chips with the circuit board are disposed on the contact surface Ld2.

Figure 2:
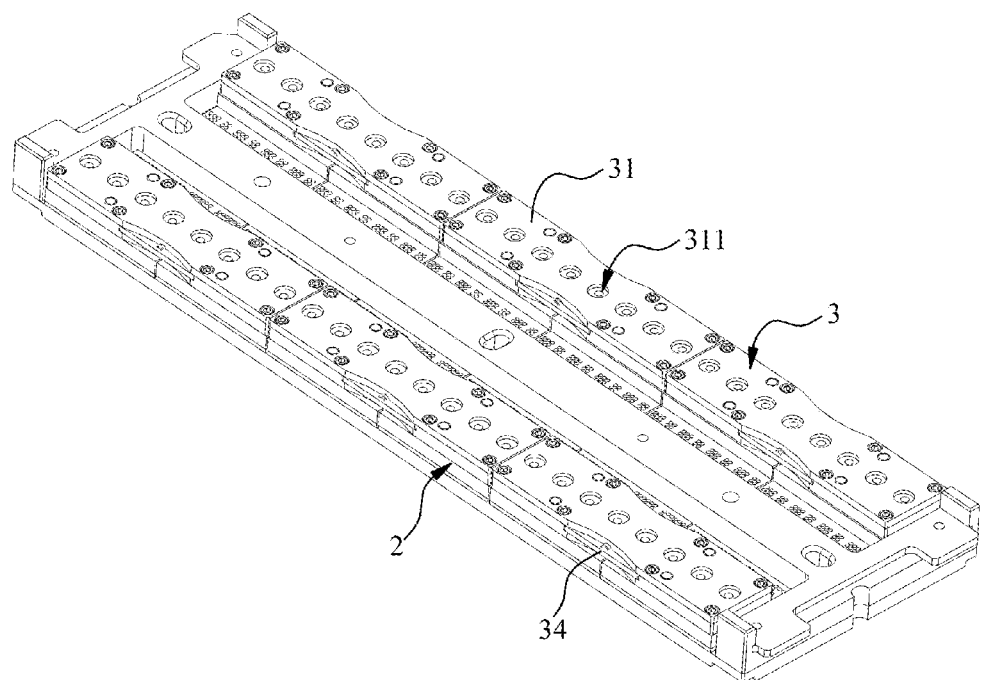
FIG. 2 is a perspective view showing a preferred embodiment of the fixture assembly according to the present invention.
Figure 3:
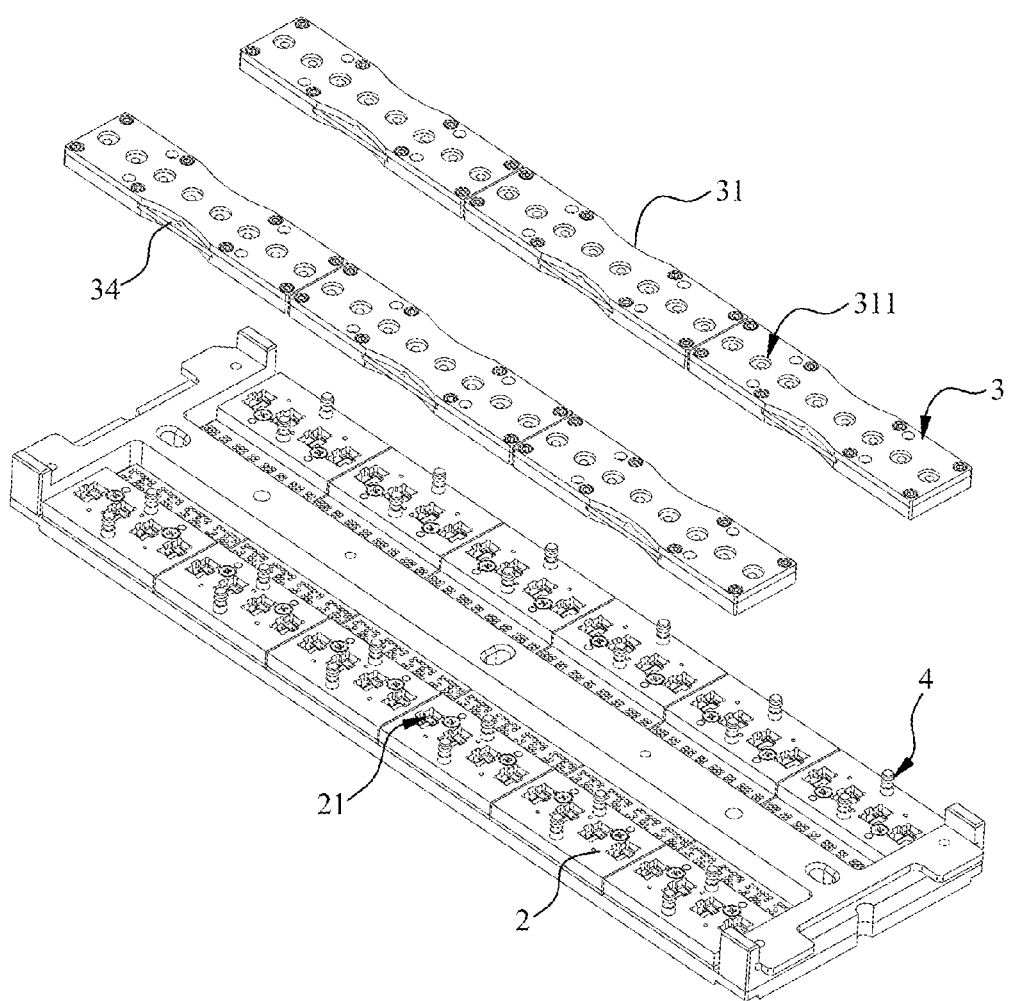
FIG. 3 is a perspective view of the fixture assembly of the present invention showing the upper cover being separated from the base.

With reference now to FIG. 2 which is a perspective view showing a preferred embodiment of the fixture assembly according to the present invention; and FIG. 3 which is a perspective view of the fixture assembly of the present invention showing the upper cover being separated from the base. As illustrated in the figures, the fixture assembly according to this embodiment mainly includes a base 2, an upper cover 3 and a latching mechanism 4. The base 2 includes a number of pockets 21, each of which for receiving a surface emitting laser diode Ld.

Figure 4:
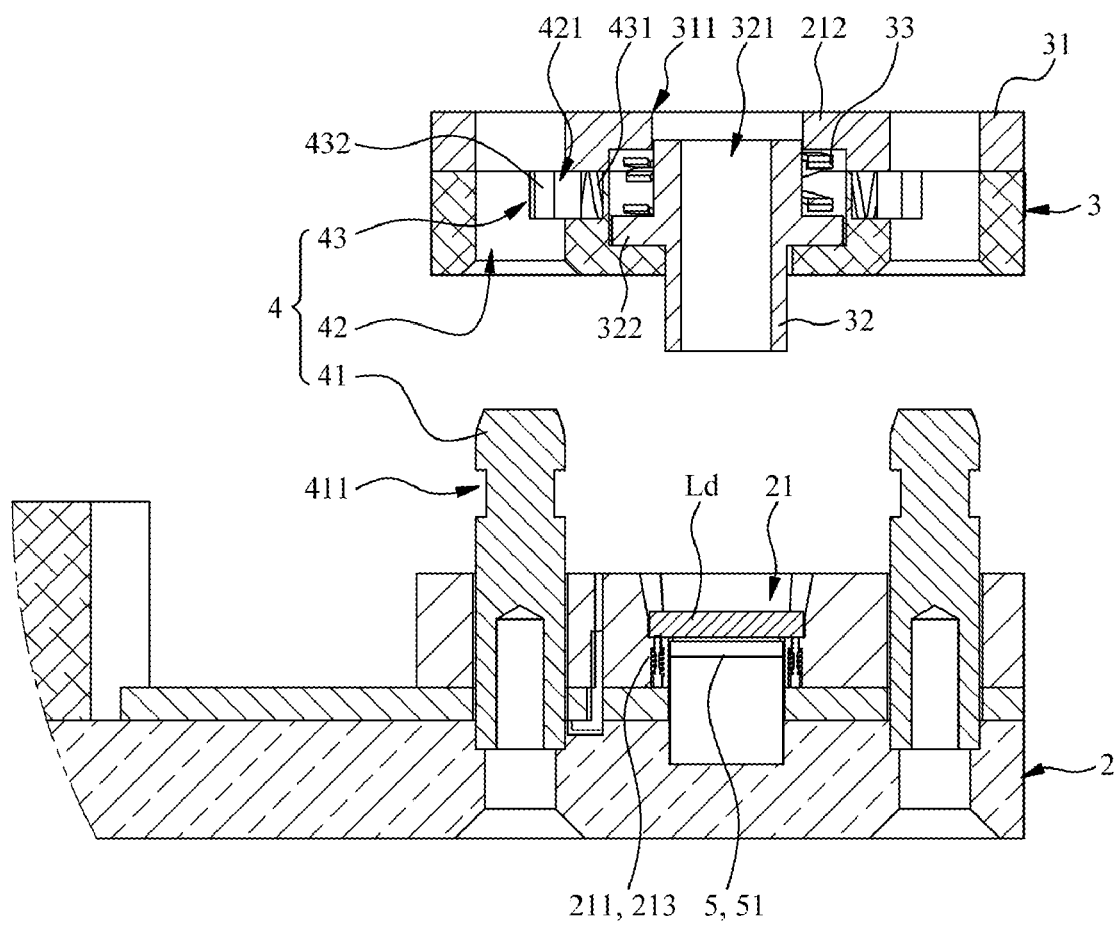
FIG. 4 is a cross-sectional view of the fixture assembly of the present invention showing the upper cover being separated from the base.

FIG. 4 is a cross-sectional view of the fixture assembly of the present invention showing the upper cover being separated from the base. A temperature control unit 5 is disposed in the pocket 21 for heating or cooling the surface emitting laser diode Ld. An electrical contact interface 211 is further provided on the periphery of the temperature control unit 5. As the fixture assembly of this embodiment is intended for burn-in test, the temperature control unit 5 adopts a thermal pedestal 51 with a temperature control surface.

This embodiment is characterized in that the temperature control surface is just a really flat durable highly conductive thermally interface, which contacts the lower surface of the surface emitting laser diode Ld directly. The thermal pedestal 51 is coupled to a temperature controller (not shown) via a thermal path. However, the present invention is not limited thereto, and other heating or cooling modules are also applicable. Further, the electrical contact interface 211 of the present embodiment is formed of spring pins or probes 213 surrounding the thermal pedestal 51, and are intended for electrically contacting the electrical contacts (not shown) on the contact surface Ld2 of the surface emitting laser diode Ld.

According to this embodiment, the upper cover 3 includes a body 31, a plurality of abutting blocks 32, and a plurality of pressing members 33. The body 31 has a plurality of through holes 311 each corresponds to a pocket 21 of the base 2. An abutting block 32 is slidably disposed in each of the through holes 311. A locking portion 212 is provided in each through hole 311, and each abutting block 32 includes a stop 322. In this embodiment, the pressing member 33 is formed of a compression spring which is arranged in the through hole 311 in between the locking portion 212 and the stop 322. The compression spring not only provides restoring function for the abutting block 32 when slidably moved, it can also provide a tensile force that may act as a downward pressing force for the abutting block 32.

As shown, each of the latching mechanisms 4 includes a latch post 41, an insertion slot 42 and a latch member 43. The latch post 41 extends upwardly from an upper surface of the base 2, and the insertion slot 42 is arranged on the upper cover 3 and extends therethrough. The insertion slot 42 of the upper cover 3 corresponds to the latch post 41 of the base 2. The latch member 43 includes a clamping block 432 and a spring 431. The insertion slot 42 has a receiving slot 421 for receiving the clamping block 432 and the spring 431. The spring 431 biases the clamping block 432, and the latch post 41 includes a notch 411. The clamping block 432 is biased by the spring 431 to slidably move between the receiving slot 421 and the notch 411.

Figure 5:
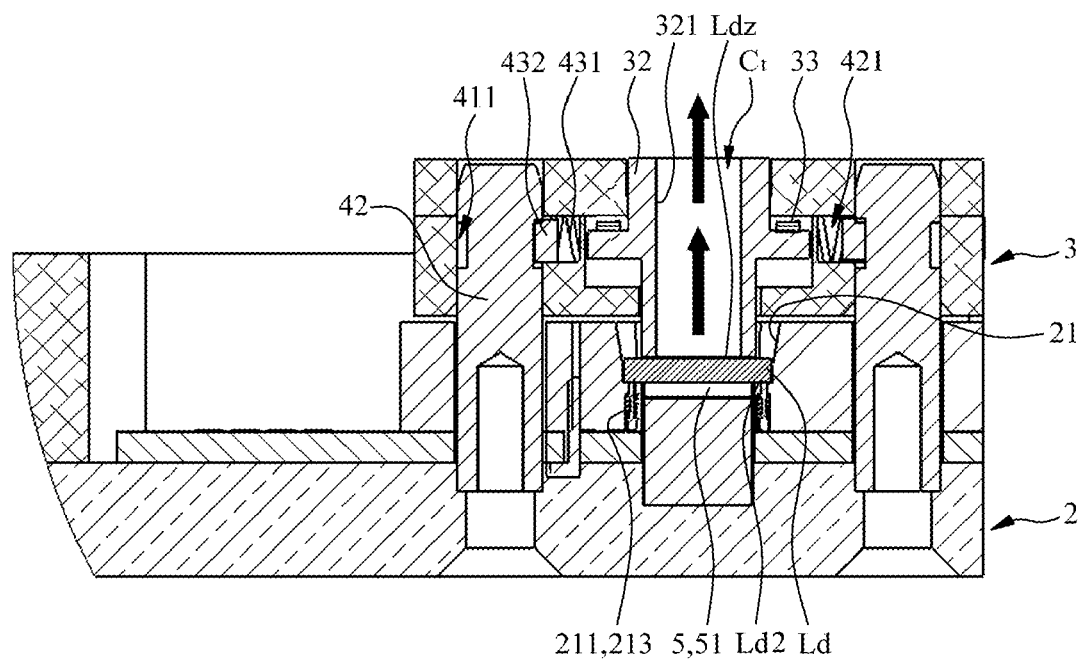
FIG. 5 is a cross-sectional view of the fixture assembly of the present invention showing the upper cover being attached to the base.

FIG. 5 is a cross-sectional view of the fixture assembly of the present invention showing the upper cover being attached to the base. When the latch mechanism 4 is actuated to connect the upper cover 3 to the base 2, the clamping block 432 is biased by the spring 431 and locked between the receiving slot 421 and the notch 411. At this instant, the latch mechanism 4 secures the base 2 and the upper cover 3, and the pocket 21 and the opening 321 form a through cavity Ct.

At this instant, the pressing member 33 that is subjected to compression generates a spring force which is applied onto the emitting surface Ld1 of the surface emitting laser diode Ld through the abutting block 32. That is, the abutting block 32 presses downward to abut the surface emitting laser diode Ld, so that the contact surface Ld2 of the surface emitting laser diode Ld makes full contact with the spring pins 213 of the electrical contact interface 211 to establish electrical conduction. At this time, the light emission area Ldz of the surface emitting laser diode Ld may emit laser emissions through the opening 321 of the abutting block 32. Further, the maximum amount of emissions of the light emission area Ldz is important for testing, the maximum divergence angle of the surface emitting laser diode Ld are accounted. for in the opening 321.

Referring again to FIGS. 2 and 3, each latch mechanism 4 according to this embodiment further includes a button 34 that is connected to a clamping block 432 and is disposed on the upper cover 3. After the test is completed, simply pressing the button 34 of the upper cover 3 would disengage the clamping block 432 from the notch 411 of the latch post 41, thereby releasing the locking between the upper cover 3 and the base 2. The upper cover 3 can then be easily separated from the base 2.

Figure 6:
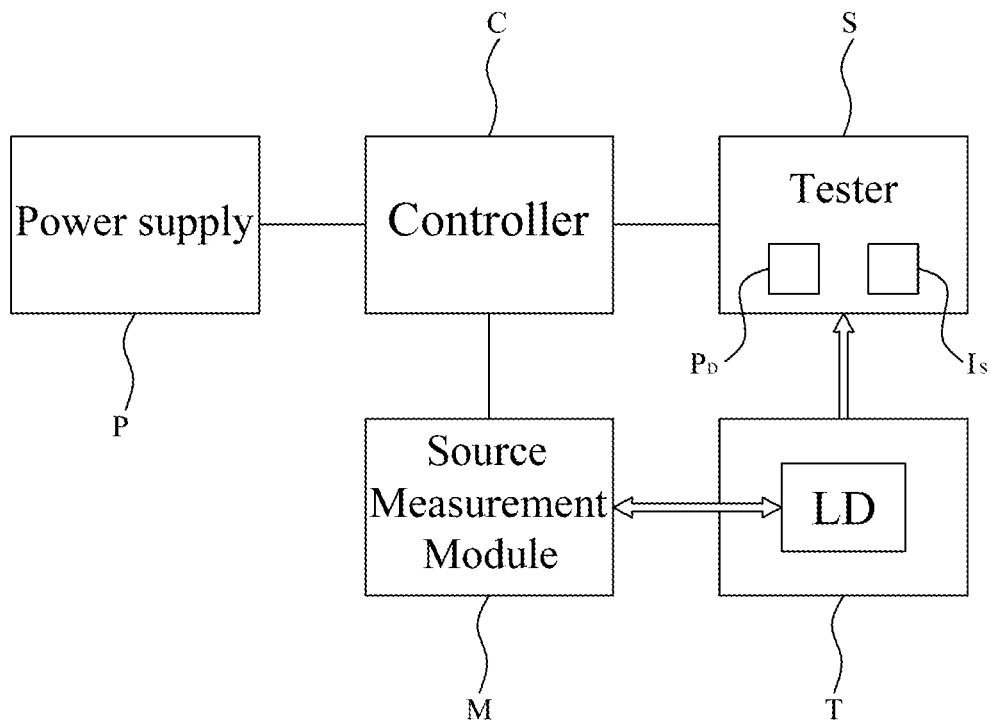
FIG. 6 is a system framework of a preferred embodiment of the testing apparatus according to the present invention.

FIG. 6 is a system framework of a preferred embodiment of the testing apparatus according to the present invention. The testing apparatus comprises a power supply P, a fixture assembly T for testing surface emitting laser diodes as stated hereinbefore, a source measurement module M, a tester S, and a main controller C. The power supply P, the tester S and the source measurement module M are electrically connected to the main controller C. The tester S corresponds to the opening 321 of the abutting block 32.

When the latch mechanism 4 is operated to connect the base 2 to the upper cover 3, that is, when the electrical contacts of the contact surface Ld2 of the surface emitting laser diode Ld electrically contact the spring pins 213, the source measurement module M will supply power to and activate the surface emitting laser diodes Ld, and the source measurement module M will measure a voltage, from this the status of the surface emitting laser diode Ld can be tested and monitored electrically. At this instant, the light emission area Ldz of the surface emitting laser diode Ld may emit a laser emissions that passes through the through cavity Ct and out from the upper cover 3. Then the main controller C controls the tester S to measure the emission characteristics of the surface emitting laser diode Ld, wherein the tester S is used to either monitor or test the laser emissions through an integrating sphere $I_s$ for volume of light and a photodetector $P_D$ for wavelength.

In summary, the present invention has the following advantages and characteristics:
1. Force is applied onto the abutting block 32 through the pressing member 33, so that the abutting block 32 and the pocket 21 may jointly hold the laser diodes to be tested Ld. As such, not only the accurate positioning of the laser diodes Ld is possible, but sufficient electrical contact between the laser diode Ld and the spring pins 213 is ensured. Also, the applied force is for the improved thermal conductivity of the laser diode.
2. The pressing member 33 would provide appropriate pressure and cushioning force and avoid the laser diodes Ld from being excessively pressed by the abutting block 32, and thus prevent the damage or breakage of the laser diodes Ld.
3. The through cavity Ct will expose completely the emitting surface Ld1 of the laser diode L, and thus the laser emissions emitted by the laser diode Ld may be emitted unobstructedly from the through cavity Ct for measurement.
4. It is possible to directly contact the laser diodes Ld to be tested by means of the temperature control surface, or contact the laser diodes Ld by other fluids for heating or cooling the laser diodes Ld. As such, high or low temperature test environment can be provided.
5. Easy to operate. Simply align the insertion slot 42 of the upper cover 3 with the latch post 41 of the base 2, and directly engage the upper cover 3 with the base 2 to complete locking. When the test is completed, simply press the button 34 on the upper cover 3 to disengage the upper cover 3 from the base 2.
6. The laser diodes are well protected as they are placed in the fixture assembly, and the chances of contact between the precision dies and the external devices are reduced, thereby avoids the dies from being damaged by any external forces.
7. The fixture assembly is compatible for different processes or equipments. For example, when performing different inspection items, the laser diodes do not need to be removed from the fixture, and the fixture components can be reused.

The preferred embodiments of the present invention are illustrative only, and are not limited to the details disclosed in the drawings and the specification. Many changes can be made by those having ordinary skill in the art without departing from the equivalent changes and modifications made by the claims of the present invention, and should belong to the scope of the present invention.

What is claimed is:

1. A fixture assembly for testing at least one surface-emitting laser diode, comprising:
   a base having at least one pocket, and at least one electrical contact interface disposed in the at least one pocket;
   an upper cover having a body formed with at least one through hole, at least one abutting block slidably disposed in the at least one through hole and slidable with respect to the body, at least one compression spring disposed in the at least one through hole, and at least one locking portion provided in the at least one through hole; the at least one abutting block includes a stop and an opening, the at least one compression spring arranged between the at least one locking portion and the stop; and
   a latch mechanism disposed on at least one of the base and the upper cover, and is configured to selectively connect or disconnect the base to or from the upper cover;
   wherein, in response to the latch mechanism being operated to connect the base to the upper cover, the at least one pocket and the opening of the at least one abutting block form into a through cavity.

2. The fixture assembly according to claim 1, wherein the latch mechanism having at least one latch post extending upwardly from an upper surface of the base, at least one insertion slot arranged on the upper cover, and at least one latch member disposed in the at least one insertion slot is operated to secure the at least one latch post.

3. The fixture assembly according to claim 2, wherein the at least one latch member includes a clamping block and a biasing spring biasing the clamping block, the at least one insertion slot is provided with a receiving slot for receiving the clamping block and the biasing spring, and the at least one latch post includes a notch, the clamping block is operated to be biased by the biasing spring and locked between the receiving slot and the notch.

4. The fixture assembly according to claim 1, wherein the base further includes a temperature control unit disposed in the at least one pocket for heating or cooling the at least one surface-emitting laser diode.

5. The fixture assembly according to claim 4, wherein the temperature control unit includes a thermal pedestal disposed at the bottom of the at least one pocket and facing the bottom surface of the at least one surface-emitting laser diode.

6. The fixture assembly according to claim 5, wherein the at least one electrical contact interface comprises a plurality of probes disposed on the periphery of the thermal pedestal.

7. A testing apparatus comprising:
   a power supply;
   a fixture assembly for testing at least one surface-emitting laser diode as claimed in claim 1, the fixture assembly being configured to receive the at least one surface-emitting laser diode;
   a source measurement module; and
   a main controller for electrically connecting the power supply and the source measurement module;
   wherein the source measurement module is configured to activate the at least one surface-emitting laser diode, and an electrical test and optical tests of the at least one surface-emitting laser diode are undertaken by the main controller.

8. A fixture assembly for testing at least one surface emitting laser diode comprising a contact surface, and an emitting surface having a light emission area, the fixture assembly comprising:

a base having at least one pocket for receiving the surface emitting laser diode, and at least one electrical contact interface disposed in the at least one pocket for electrically connecting the contact surface of the at least one surface-emitting laser diode;

an upper cover having a body, at least one abutting block, and at least one compression spring, the body has at least one through hole for slidably receiving the at least one abutting block; the at least one compression spring is disposed in the at least one through hole; and the at least one abutting block includes an opening;

a latch mechanism disposed on at least one of the base and the upper cover, and is configured to selectively connect or disconnect the base to or from the upper cover;

wherein, in response to the latch mechanism being operated to connect the base to the upper cover, the at least one compression spring applies a force through the at least one abutting block on the emitting surface of the at least one surface-emitting laser diode, the contact surface of the at least one surface-emitting laser diode contacts the at least one electrical contact interface, and the opening of the at least one abutting block exposes at least a portion of the light emission area.

9. The fixture assembly according to claim 8, wherein the base further includes a temperature control unit disposed in the at least one pocket for heating or cooling the at least one surface-emitting laser diode.

* * * * *